United States Patent
Spartiotis

(10) Patent No.: US 7,361,881 B2
(45) Date of Patent: Apr. 22, 2008

(54) GANGED DETECTOR PIXEL, PHOTON/PULSE COUNTING RADIATION IMAGING DEVICE

(75) Inventor: Konstantinos E. Spartiotis, Espoo (FI)

(73) Assignee: OY Ajat Ltd, Espoo (FI)

( * ) Notice: Subject to any disclaimer, the term of this patent is extended or adjusted under 35 U.S.C. 154(b) by 49 days.

(21) Appl. No.: 10/194,336

(22) Filed: Jul. 11, 2002

(65) Prior Publication Data

US 2003/0173522 A1 Sep. 18, 2003

Related U.S. Application Data

(63) Continuation-in-part of application No. 10/154,264, filed on May 23, 2002, now Pat. No. 7,189,971.

(60) Provisional application No. 60/364,248, filed on Mar. 13, 2002.

(51) Int. Cl.
*H01L 27/00* (2006.01)
*G01J 1/44* (2006.01)

(52) U.S. Cl. .............................. 250/214 L; 250/214 A; 250/208.1

(58) Field of Classification Search ............. 250/208.1, 250/370.09, 214 A, 214 L, 214.1; 257/233; 348/298
See application file for complete search history.

(56) References Cited

U.S. PATENT DOCUMENTS

| | | | |
|---|---|---|---|
| 5,151,588 A | 9/1992 | Kiri et al. | |
| 5,665,959 A * | 9/1997 | Fossum et al. | 250/208.1 |
| 5,812,191 A | 9/1998 | Orava et al. | |
| 5,952,646 A | 9/1999 | Spartiotis et al. | |
| 6,069,362 A * | 5/2000 | Giakos | 250/394 |
| 6,107,655 A * | 8/2000 | Guidash | 257/233 |
| 6,175,611 B1 | 1/2001 | Melen et al. | |
| 6,207,944 B1 * | 3/2001 | Spartiotis et al. | 250/208.1 |
| 6,248,990 B1 | 6/2001 | Pyyhtia et al. | |
| 6,316,773 B1 * | 11/2001 | Giakos | 250/394 |
| 6,355,923 B2 | 3/2002 | Pyyhtia et al. | |
| 6,703,617 B1 * | 3/2004 | Spartiotis et al. | 250/370.09 |
| 6,933,505 B2 * | 8/2005 | Vuorela | 250/370.13 |
| 2001/0001562 A1 * | 5/2001 | Orava et al. | 348/302 |
| 2001/0002844 A1 * | 6/2001 | Orava et al. | 348/218 |
| 2001/0025914 A1 * | 10/2001 | Pyyhtia et al. | 250/208.1 |
| 2003/0155516 A1 * | 8/2003 | Spartiotis et al. | 250/370.09 |
| 2003/0173523 A1 * | 9/2003 | Vuorela | 250/370.13 |

\* cited by examiner

*Primary Examiner*—Frank G. Font
*Assistant Examiner*—Mary El-Shammaa
(74) *Attorney, Agent, or Firm*—Young & Thompson

(57) ABSTRACT

A ganged-detector pixel cell is used in a device having an array of such pixel cells to construct an x-ray and gamma-ray radiation energy imaging device. The ganged-detector pixel cell comprises a detector pixel array of two or more detectors pixels disposed on a semiconductor detector substrate. The detector pixels of the pixel array are in electrical communication with a single pixel signal counting circuit disposed on an adjacent ASIC readout substrate. The ganged-detector pixel cell has a Ratio of Correspondence (RC) between of the number of pixel detectors to the single pixel signal counting circuits in the cell of RC≧1. In practice, the Ratio of Correspondence between of the number of pixel detectors to the single pixel signal counting circuits in a pixel cell is RC≧2.

14 Claims, 6 Drawing Sheets

GANGED DETECTOR PIXEL, PHOTON/PULSE COUNTING RADIATION IMAGING DEVICE

The present application is a continuation-in-part and claims the benefit of prior U.S. National Application Ser. No. 10/154,264 filed 23 May 2002 now U.S. Pat. No. 7,189,971 and U.S. Provisional Application Ser. No. 60/364,248 filed 13 Mar. 2002.

FIELD OF THE INVENTION

The present invention is in the field of semiconductor devices for detecting and image analyzing x-ray and gamma ray radiant energy. More specifically, the present invention relates to such devices wherein image analysis occurs by way of incident radiant energy on the device producing current flow in a pixel cell having multiple electrically accessible points on two different semiconductor substrates. In particular, the present invention relates to radiation photon/pulse counting imaging devices wherein, overall, the pixel cells have a larger number of detector pixels processed onto the photo-conductor/detector substrate than the number of pixel counting circuits processed onto the counting/readout substrate with which the detector pixels communicate.

BACKGROUND OF THE INVENTION

Over the past ten years digital radiation imaging has gradually been replacing conventional radiation imaging for certain applications. In conventional radiation imaging applications, the detecting or recording means is a photo-sensitive film or an analog device such as an Image Intensifier. Digital radiation imaging is performed by converting radiation impinging on the imaging device to an electronic signal inside a converting material and consequently digitizing such electronic signal.

Devices for performing digital radiation imaging currently exist, and typically fall into two classes: direct radiation detection and indirect radiation detection. In direct radiation detection devices, the impinging or incident radiation is converted locally into electrical charge which is then collected at collection contacts/detector pixels, and then communicated as electronic signals to readout circuits. The readout circuits perform various functions including digitization.

Direct radiation detection devices typically comprise a photo-conductor or detector substrate which converts the impinging radiation into electronic signals, and a readout substrate which receives, processes and reads out the electronic signals for imaging. There are different kinds of photo-conductor/detector substrate technologies and as well as different readout substrate technologies used in direct radiation detection devices. These include: SBBASIC (Semiconductor Bump-Bonded on ASIC), a-SGTFT (amorphous Semiconductor Grown on TFT), and a-SGASIC (amorphous Semiconductor Grown on ASIC). ASIC stands for Application Specific Integrated Circuit and TFT stands for Thin Film Transistor array.

SBBASIC-type imaging devices typically comprise at least two substantially coplanar semiconductor substrates: a crystalline semiconductor detector/photo-conductor substrate discretely bonded to a semiconductor readout substrate. Typically, the detector/photo-conductor substrate has a first major surface for receiving radiation impinging on the device, and a second opposite major surface on which is disposed a two dimensional array of detector pixels. Incoming radiation impinges on the first surface of the detector substrate and is absorbed in the thickness of the photo-conductor material. In response to the absorption of the radiation, electrical charges are generated in the photo-conductor material. For example, if the photo-conductor material is CdTe, 45 keV of impinging radiation energy may generate a charge of about 10,000 electrons, and similarly, 70 keV of radiation energy may generate a charge of 15,500 electrons, 100 keV of radiation energy may generate about 22,000 electrons, and 140 keV of radiation may generate about 31,000 electrons. Other photo-conductor materials may generate different levels of charge on the absorption of similar levels of impinging radiation, but in a similar manner.

Under the influence of an electrical field, the generated charges drift toward and are collected at the charge collectors (or charge collection electrodes) at the second surface of the detector substrate. Each charge collector contact defines a "detector pixel" on the detector substrate's second surface. Each detector pixel is conductively connected to a "pixel circuit input" on the adjacent surface of the readout substrate. In a SBBASIC-type imaging device, the connection between a detector pixel and a pixel circuit input is accomplished by a bump-bond. In photon/pulse counting SBBA-SICs, each pixel circuit input is an input to an ASIC pixel counting circuit processed onto the readout substrate. The ASIC pixel counting circuit can include a plurality of various circuits or features for amplifying, storing, digitizing, etc. the electrical charge signals from the detector substrate and count the photons absorbed or the charge pulses generated.

Photon or pulse counting imaging devices have stimulated considerable interest in both the scientific and commercial communities because they offer the potential for some significant advantages over other related technologies:

1. Because the charge pulse generated by each photon is processed individually it can provide information about the energy of the photon absorbed. Thus photons can be counted or discarded depending on their energy level. This in turn enhances the contrast resolution because photons of lower energy are typically scattered photons that, unless discarded, would deteriorate image quality.
2. Since electronic signals due to photon pulses are digitized and counted the device is less sensitive to background noise, detector leakage/dark current etc. Note, "dark current" is the background current flow in the device absent the presence of impinging radiation.
3. There is no need for outside digitization, because it is done "on chip," which makes the imaging system simpler and potentially less expensive.

Recognizing these advantages, the field has been motivated to develop photon/pulse counting digital imaging devices embodying them. U.S. Pat. Nos. 6,248,990 and 6,355,923 to Pyyhtia el al. are relatively exemplary of some of the latest efforts to embody the advantages of photon/pulse counting in digital imaging devices.

FIGS. 1A and 1B generally illustrate an array of pixel cells 20 typical of the prior art in the field and as taught by the Pyyhtia '990 patent. The pixel cell 20 comprises a single detector pixel 36 in electrical communication with a single pixel counting circuit 31 on the readout semiconductor substrate 32. The charge collector electrode 38 of the detector pixel 36 is processed onto the pixel surface 40 of the detector semiconductor substrate 30. The charge collector electrode 38 is electrically connected to the pixel circuit input 33 of the pixel signal counting circuit 31 on the readout surface 42 of the readout semiconductor substrate 32 via a pixel contact (bump-bond) 35. The photo-conductor material 34 of the detector pixels 36 absorbs incoming radiation, and in response to the absorption generates electrical charges. The electrical charges are collected at the charge collector electrodes 38, and electrically communicated through the pixel contact bump-bonds 35 to the pixel circuit input 33 of the pixel signal counting circuit 31 on the readout semiconductor substrate 32. Also see Orava et al., U.S. Pat. No. 5,812,191 and Spartiotis et al., U.S. Pat. No. 5,952,646, which disclose alternative embodiments of an SBBASIC-type digital radiation imaging devices, FIG. 1B as an alternative illustration of the prior art embodied in FIG. 1A. Very recently, Pyyhtia et al., U.S. Pat. No. 6,355,923 disclosed developments in the art field as moving in the direction of having each detector pixel 36 being associated with one or more than one pixel signal counting circuit 31. Specifically as shown in FIG. 2, in the prior art device of the '923 patent, a detector pixel 36 can be in electrical communication with more than one pixel signal counting circuit 31.

The photon/pulse counting devices of the above cited prior art have a numerical relationship between the detector pixels and the pixel signal counting circuits such that the number of detector pixels is always equal to or less than the number of pixel cell counting circuits. Although this approach is seemingly straightforward and simple, it has certain potentially significant functional limitations relating to image quality or resolution due to: (1) hole trapping and (2) charge sharing between pixels.

Regarding Hole Trapping

In imaging devices utilizing the currently most desirable and most radiation absorbent of the photo-conductor materials, such as CdTe and CdZnTe, energy resolution can be limited by "hole trapping." In simple terms, every time a high energy photon is captured inside these semiconductor detector materials, an equal amount of electron and hole signal is generated. The electrons are quite mobile and reach the electron collector electrode of a detector pixel relatively fast. However, the holes migrate rather slowly compared to the electrons, and before the holes can complete their migration (e.g., toward a negatively charged electrode) they get trapped. As a result the final induced signal suffers in energy resolution.

Semiconductor detector theory predicts that the smaller in size the electron collecting detector pixels the better for the final induced signal. A thorough analysis of the "small pixel effect" can be found in "Signals induced in semiconductor gamma-ray imaging devices", Journal of Applied Physics, Volume 85, Number 2, page 647, Jan. 1, 1999 by J. D. Eskin et al. This "small pixel" effect though "works" the opposite direction needed for eliminating the "charge sharing" between detector pixels discussed in the next item. Further, more typical photon/pulse counting applications intended for nuclear medicine require a rather large image pixel cell on the order of 0.5 mm-4 mm. Decreasing the image pixel size and increasing the number of readout channels would increase correspondingly readout complexity.

Charge Sharing Between Detector Pixels

As electrons drift towards the charge collecting detector pixels they also drift apart in the lateral direction. Depending on the thickness of the photo-conductor detector material and the energy of the absorbed photon, by the time an electron charge package reaches the detector pixels the dimensions of the charge package may have increased and its charge density decreased. If the detector pixels are made smaller to compensate for hole trapping according to item (1), then the charge package will be shared by more than one pixel. This charge sharing between detector pixels could create a false signature (hit or miss) in the pixel signal counting circuit associated with a pixel detector receiving a share of a charge package, because one initially larger pulse will be seen as two separate smaller pulses.

So, to eliminate the "charge sharing effect" a detector pixel's charge collecting electrode (which define the size of the detector pixel) needs to be as large as possible. However this resolution of the "charge sharing effect" contravenes the means for resolving the "hole trapping" problem discussed above.

Therefore, in view of these limitations on image quality or resolution, it would be beneficial in the field to have an alternative digital radiation imaging device that reduces or substantially eliminates the limitations on image quality or resolution due to both "hole trapping" and "charge sharing" effects. For example, it would be advantageous to have a photon/pulse counting imaging device wherein the detector pixel size is decreased to achieve the beneficial "small pixel effect" to reduce or eliminate hole trapping problems, while not increasing the number of pixel signal counting circuits, so that when decreasing the detector pixel size pixel signal processing speed is not compromised.

SUMMARY OF THE INVENTION

The present invention is a radiation imaging device preferably for imaging radiation in the x-ray and gamma ray frequency range at the greater than 1 keV. More specifically, the present invention is a photon/pulse counting digital imaging device, a Ganged-Detector Pixel Cell Array ("GDPC array"). The GDPC array comprises multiple "ganged-detector" pixel cells (GDPCs) arrayed in close proximity with each other in a laminate structure formed of two semiconductor substrates: a detector/photo-conductor substrate and a counting/readout substrate. The semiconductor substrates have a substantially planar configuration and are disposed adjacent each other with their planes in parallel to form a laminate structure in the assembled imaging device.

The material of semiconductor detector/photo-conductor substrate generates electrical charge in response to absorbing radiation hits incident on the detector substrate's major first or radiation surface. Photo-conductor materials are known in the art and are readily selectable by the ordinary skilled artisan for practice in the present invention. Examples of such photo-conductor materials include: CdTe, CdZnTe, GaAs, Si, Ge, PbI, HgI, T1Br and CdHgTe. The detector substrate is substantially planar and has a major second or pixel surface on which is processed a detector array of a plurality of detector pixel. The semiconductor counting/readout substrate also has a major first or readout surface having a pixel circuit array of a plurality of pixel signal counting circuits processed thereon. In combination, the semiconductor detector and readout substrates define a GDPC array of a plurality of the present "ganged-detector" pixel cells.

A ganged-detector pixel cell of the present invention is defined as a unit comprising one pixel signal counting circuit in electrical communication with a plurality of associated pixel detectors for counting radiation hits impinging on the detector substrate of the associated pixel detectors. Further, each ganged-detector pixel cell is defined by its pixel detectors being in electrical communication only with the one associated pixel signal counting circuit. Consequently, in either an individual ganged detector pixel cell or in the GDPC array as a whole, the number of detector pixels processed onto the detector substrate is always larger than the number of pixel signal counting circuits processed onto the counting/readout substrate.

In other words, the present x-ray and gamma-ray radiation energy imaging device comprise an array of multiple "ganged-detector" pixel cells. An individual "ganged-detector" pixel cell is defined a single pixel signal counting circuit in electrical communication with a number (gang) of associated detector pixels, with the associated detector pixels (ganged-detector pixels) only in electrical communication with the single pixel signal counting circuit.

The detector pixels are disposed in a detector pixel array processed onto the pixel surface of the semiconductor detector substrate. The detector pixels of the pixel array are in electrical communication with a single pixel signal counting circuit disposed on an ASIC readout substrate. Each detector pixel comprises a pixel collector electrode and an associated pixel contact. The pixel collector electrode collects the electrical charges generated in the photo-conductor material of the detector substrate. In combination, pixel collector electrodes of the individual detector pixels of the ganged-detector pixel array substantially cover the pixel surface of the ganged-detector pixel cell. The pixel contact of each detector pixel is in communication with the single pixel counting circuit of the ganged-detector pixel cell for conducting the electrical charges out of the pixel detector.

Each ganged-detector pixel cell of the GDPC array comprises a single pixel signal counting circuit processed onto the readout surface of the ASIC readout substrate. The ASIC readout substrate may have a plurality of pixel signal counting circuits disposed on its readout surface, with each pixel signal counting circuit defining the single pixel signal counting circuit of an individual ganged-detector pixel cell. Additionally, each pixel signal counting circuit has multiple pixel signal inputs processed on its readout surface. The multiple pixel signal inputs are each in electrical communication with the pixel signal counting circuit of the ASIC readout substrate, and with the pixel contact of one of the associated detector pixels of its ganged-detector pixel cell. The number of pixel signal inputs to a counting circuit is sufficient to provide an electrical communication input to the counting circuit for each separate detector pixel contact of the ganged-detector pixel array with which the counting circuit is associated.

The multiple pixel signal inputs of a pixel signal counting circuit each comprises a signal conditioning circuit. A pixel signal conditioning circuit itself comprises one or more ancillary circuits. The conditioned output from the pixel signal conditioning circuit is communicated to the pulse counter circuitry of the pixel signal counting circuit. The pulse counter circuitry also may comprise one or more ancillary circuits. Ancillary circuits practicable in the present invention include: signal amplification circuitry, current compensation circuitry, pulse width control circuitry, gain control circuitry, pulse shaping circuitry, single/multi-stage comparator circuitry, analog adder circuitry, buffer circuitry and other appropriate circuitry as known to and practicable by the ordinary skilled artisan in the present invention.

The pixel contacts disposed on each pixel electrode for conducting the electrical charges out of the pixel detector is a bump-bond, and in a preferred embodiment is a solder bump-bond. One of the benefits and features of the present invention relates to the use of bump-bonds in prior imaging devices to mechanically attach the semiconductor substrates together to form a planar laminate as well as to provide electrical connectivity between the substrates. In such prior digital radiation imaging devices as cited above, the Ratio of Correspondence between the number of pixel detectors and pixel circuits is 1 or less, therefore the Ratio of Correspondence between bump-bond mechanical adhesion points and pixel circuits is also 1 or less. In this case, there can be no more than one bump-bond per pixel circuit to provide a mechanical adhesion point in the device. However, in the present invention, the Ratio of Correspondence between the number of pixel detectors and pixel circuits is greater than 1. Therefore, the Ratio of Correspondence between bump-bond mechanical adhesion points and pixel circuits is also greater than 1. In practice, the Ratio of Correspondence is preferably equal to or greater than 2. In the present invention, there is more than one bump-bonded pixel contact per pixel circuit to provide mechanical adhesion points in the device. Consequently, the adhesion point correspondence ratio of the present invention is practically two or more times that for the cited prior art device having the same number of pixel circuits. The higher adhesion point correspondence ratio provides semiconductor substrate laminate of the present invention with increased adhesion properties relative to the cited prior art devices Furthermore, for certain applications (such as nuclear medicine), it would be advantageous to accomplish some form of signal protection or redundancy, so that if a detector pixel contact is lost, the functioning of the associated pixel cell would not become "dead" altogether. In the present ganged-detector pixel cell, if one pixel detector should become non-functional, the remaining detector pixel(s) of the ganged-detector pixel array can continue to provide signal to the associated pixel circuit.

In the present invention, the GDPC array comprises at least one ganged-detector pixel cell, the GDPC having at least two detector pixels in electrical communication with a single pixel signal counting circuit. In another preferred embodiment, the GDPC comprises a detector pixel array having at least four detector pixels disposed on the semiconductor detector substrate, the detector pixels of the pixel array in electrical communication with a single pixel signal counting circuit disposed on the ASIC readout substrate. Additionally, each ganged-detector pixel cell of the GDPC array comprises a detector pixel array having a planer area of their combined collector electrodes disposed on the semiconductor detector substrate with an effective charge collection area which is substantially least as large as the planar area of the single pixel signal counting circuit disposed on the ASIC readout substrate.

DETAILED DESCRIPTION OF THE INVENTION

Figure 1A:
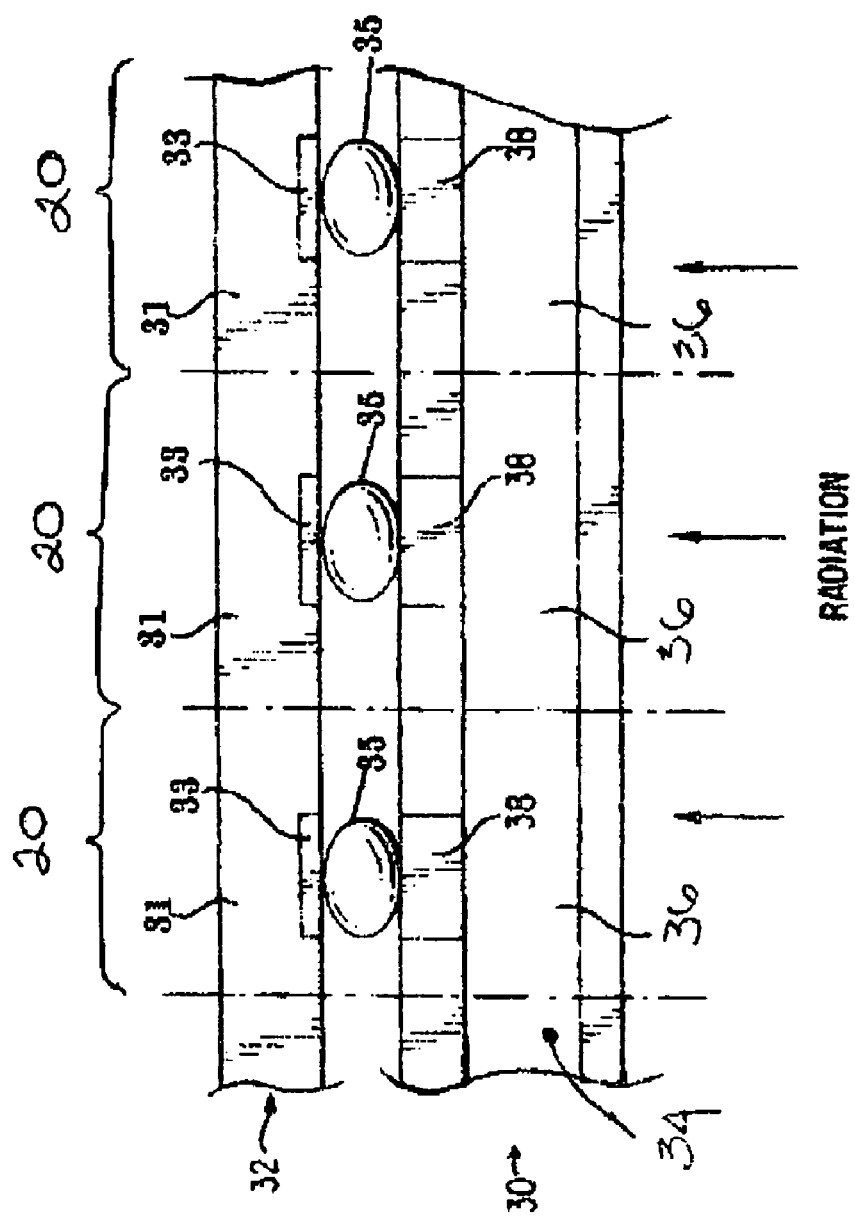
FIG. 1A is a schematic side view representation of a section of a prior art SBBASIC-type semiconductor radiation imaging device wherein each pixel circuit is associated with a single detector pixel, and vice versa, illustrating an imaging device having a Ratio of Correspondence between the number of pixel detectors and pixel circuits of 1.

Referring now to the drawings, the details of preferred embodiments of the present invention are graphically and schematically illustrated. Like elements in the drawings are represented by like numbers, and any similar elements are represented by like numbers with a different lower case letter suffix.

Figure 3A:
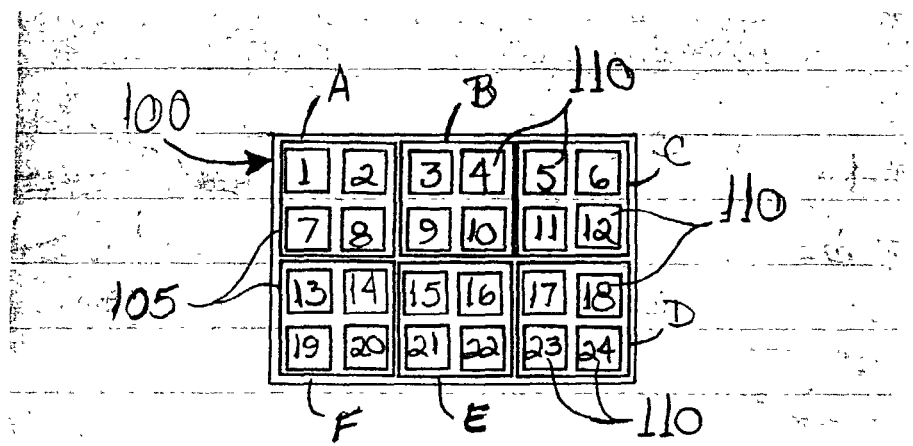
FIG. 3A is a block schematic representation of a ganged-detector pixel cell array (GDPC array) of the present invention illustrating individual ganged-detector pixel cells and their internal array of associated pixel detectors.
Figure 3B:
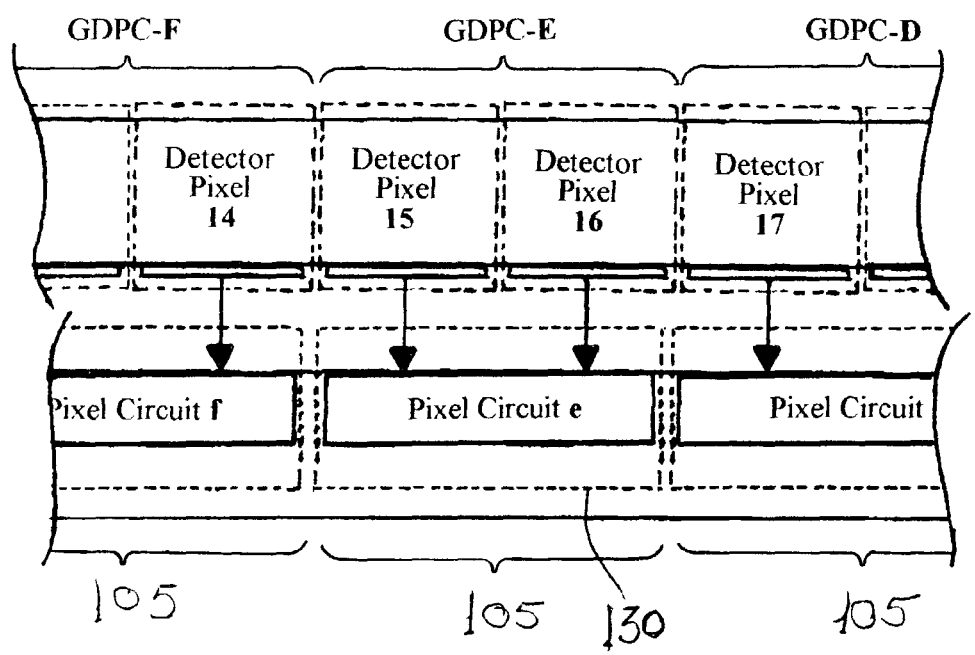
FIG. 3B is a schematic side view representation of a section of an SBBASIC-type, ganged-detector pixel cell array (GDPC array) of FIG. 3A showing that within a single pixel cell, each pixel detector electrically communicates with a single pixel signal counting circuit, but the single pixel counting circuit of the pixel cell electrically communicates with all of the detector pixels in the cell, illustrating an imaging device having a Ratio of Correspondence (RC) between the number of pixel detectors and pixel circuits in a single pixel cell is RC=4.

As exemplified in FIGS. 3A and 3B, an SBBASIC-type x-ray and gamma-ray radiation energy imaging device 100 of the present invention comprises an array of a plurality of ganged-detector pixel cells (GDPCs) 105. FIG. 3A illustrates an example of a ganged-detector pixel cell array (GDPC array) 100 of the present invention having six separate GDPCs 105 labeled A to F, and the individual GDPCs each having an internal detector array of associated detector pixels 110. Of course in practice, a GDPC array 100 may comprise any number of individual GDPCs as the applicable current or future semiconductor technology will permit. FIG. 3B is a schematic representation of a section of a GDPC array 100 showing that within a single pixel cell 105, each of the "ganged" detector pixels 110 electrically communicates with the single pixel signal counting circuit 130 in the GDPC 105. However, the single pixel counting circuit 130 of the GDPC 105 electrically communicates with all of the detector pixels 110 in the cell 105, and no others. This illustrates the object of the present invention that the present GDPC 105 have a "Ratio of Correspondence" (RC) between the number of pixel detectors 105 and the pixel circuit in a single GDPC 105 of greater than one (>1). In the example illustrated in FIGS. 3A and 3B, the Ratio of Correspondence is RC=4.

Figure 4:
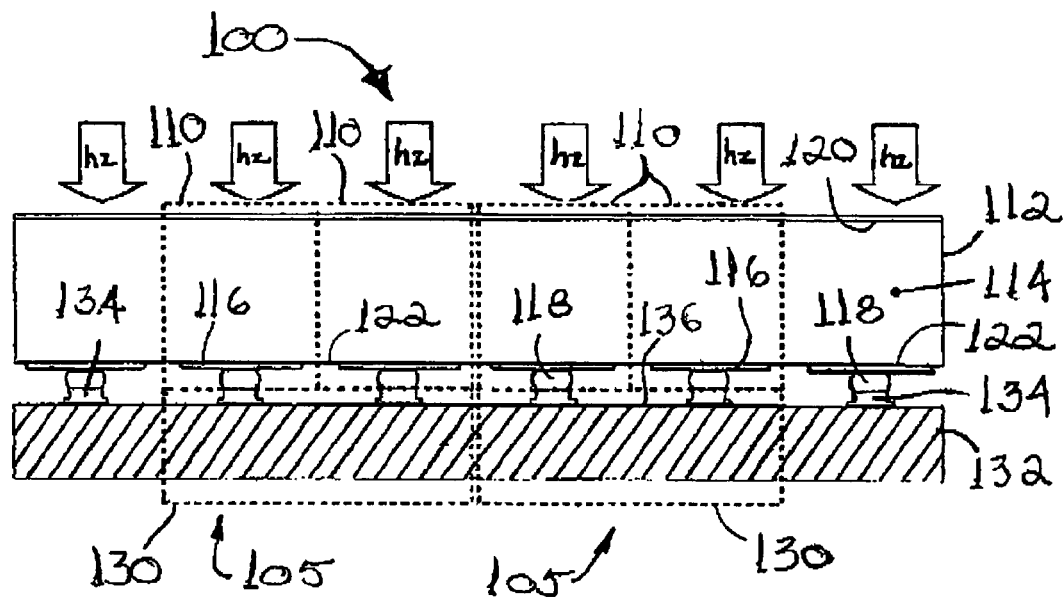
FIG. 4 is a schematic side view representation of an array of ganged detector pixel cells of the present invention, illustrating the laminate configuration of the semiconductor substrates.
Figure 1B:
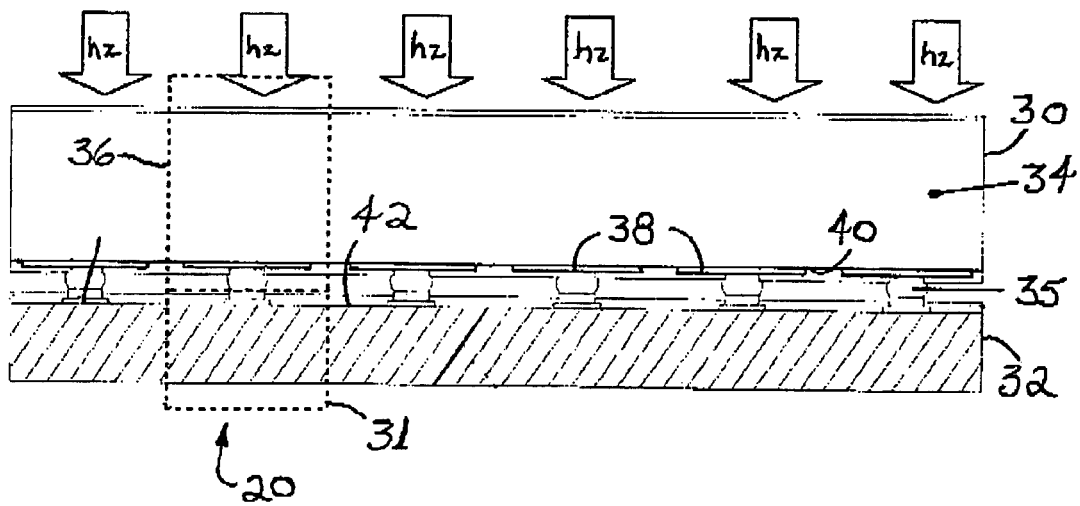
FIG. 1B is an alternative schematic representation of a side view of a section of a prior art SBBASIC-type semiconductor radiation imaging device.
Figure 2:
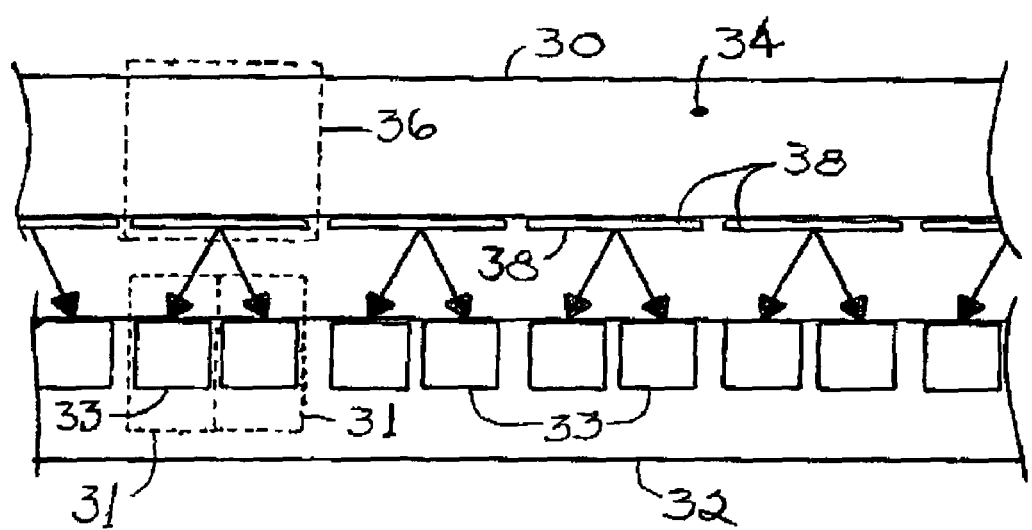
FIG. 2 is a schematic representation of a side view of a section of a prior art SBBASIC-type semiconductor radiation imaging device wherein each pixel circuit is associated with a single detector pixel, but each detector pixel is associated with more than one pixel circuit, illustrating an imaging device having a Ratio of Correspondence between the number of pixel detectors and pixel circuits of <1.

In the preferred embodiment exemplified in FIG. 4, the present x-ray and gamma-ray radiation energy imaging device comprises an array 100 of ganged-detector pixel cells 105. Each GDPC 105 comprises an array of at least two detector pixels 110 disposed on a semiconductor detector substrate 112. The thickness of the semiconductor detector substrate is comprised of a photo-conductor material 114. Each of the detector pixels 110 is in electrical communication with the single pixel signal counting circuit 130 of the GDPC 105. The pixel signal counting circuit 130 is disposed on the ASIC semiconductor readout substrate 132. The pixel charge collector electrode 116 of a detector pixel 110 collects the electrical charges generated in its vicinity in the photo-conductor material 114. The generated charges are conducted out of the detector pixel 110 through its pixel collector electrode 116 to the pixel circuit input 134 via an electrically conductive pixel contact 118 disposed between and in electrical communication with the collector electrode 116 and the pixel circuit input 134.

The semiconductor detector substrate 112 has two major surfaces: a radiation surface 120 and a pixel surface 122. The charge collector electrodes 116 of the arrayed detector pixels 110 are processed onto the pixel surface 122 of the detector substrate 112 using semiconductor techniques known in the art. The detector substrate 112 typically has a bias electrode 124 disposed on its radiation surface 120. The bias electrode 124 is transparent to the impinging radiation. In combination with each charge collector electrode 116, the bias electrode 124 generates an electric bias field across the thickness of the detector substrate 112 so that charges generated in the photo-conductor material 114 to drift toward the pixel surface 122. Although the collector electrodes 116 are spaced and/or insulated from each other, the electric bias field of a pixel detector 110 extends beyond the perimeter of its charge collector electrode 116, thus giving the GDPC 105 an effective charge collecting surface at least as large as the area of the pixel surface 122 of the GDPC 105.

As also exemplified in FIG. 4, the GDPCs 105 of the present invention each comprises a semiconductor ASIC readout substrate 132. In the preferred embodiment of the present invention as a GDPC array 100, where multiple separate GDPCs are juxtaposed in a planar array, the semiconductor readout substrate 132 (and the detector substrate 112) of adjacent GDPCs is continuous throughout the GDPC array 100. Additionally, multiple GDPC arrays may be juxtaposed to construct a large format x-ray and gamma-ray radiation energy imaging device comprising a plurality of ganged-detector pixel cells.

The single pixel signal counting circuit 130 of the separate GDPCs 105 are processed in a circuit array onto the semiconductor ASIC readout substrate 132. The ASIC readout substrate 132 has a readout surface 136 disposed opposite the pixel surface 122 of the detector substrate 112. The single pixel signal counting circuit 130 of a GDPC 105 has multiple pixel signal inputs 134 processed onto the readout surface 136 of the ASIC readout substrate 132 of the GDPC 105. The multiple pixel signal inputs 134 are the input contacts in electrical communication with the pixel signal counting circuit 130 of the GDPC 105, each pixel signal input 134 is in electrical communication with a separate detector pixel contact 118 of the arrayed detector pixels 110.

Figure 5:
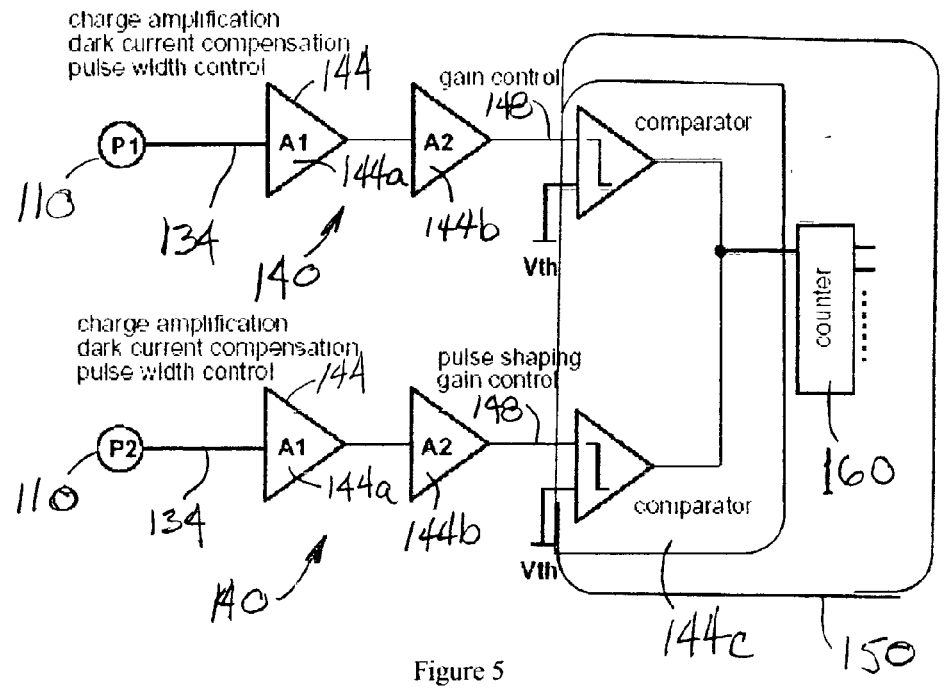
FIG. 5 is a schematic block diagram of the pixel signal counting circuit of the present invention, illustrating the multiple (two in the case shown) pixel signal inputs and their associated signal conditioning circuits communicating with a single pulse counter circuit.
Figure 6:
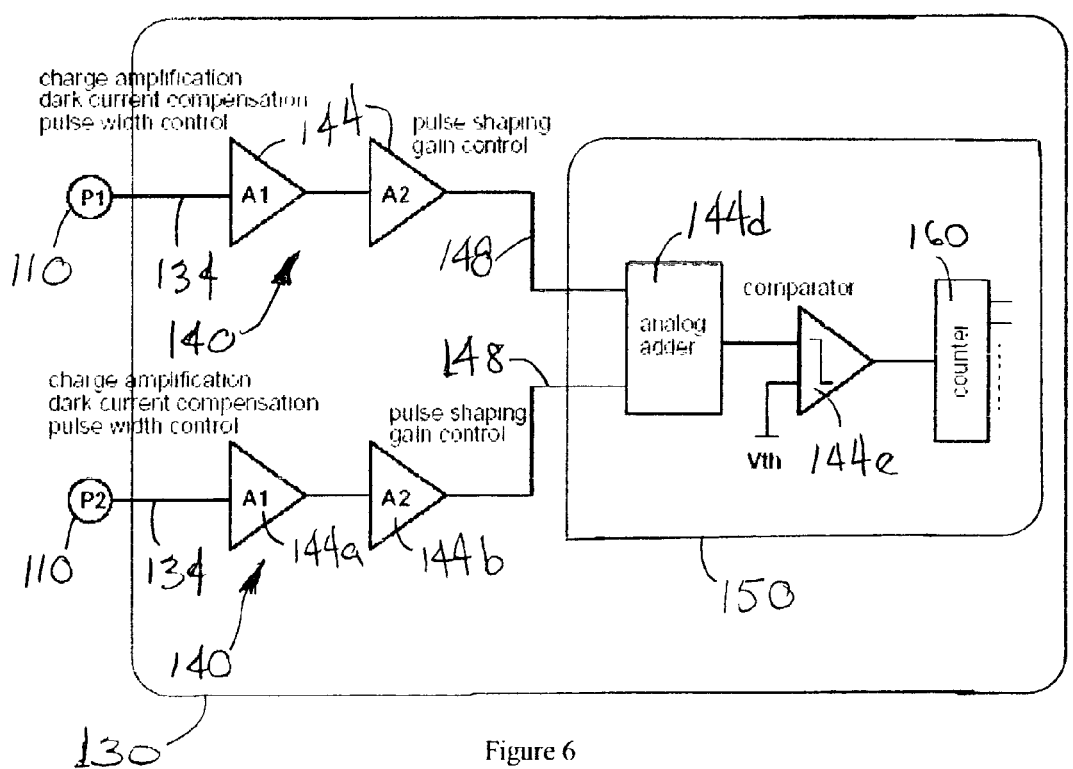
FIG. 6 is a schematic block diagram of the pixel signal counting circuit of the present invention similar to FIG. 5, but illustrating an alternative embodiment of the single pulse counter circuit.

Additionally, as shown in FIGS. 5 and 6, the pixel signal inputs 134 of the pixel signal counting circuit 130 each comprises a pixel signal conditioning circuit 140. A signal conditioning circuit 140 can further comprise one or more ancillary signal conditioning/processing circuitries 144. Examples of such ancillary signal conditioning/processing circuitries 144 includes: signal amplification circuitry, dark current compensation circuitry, pulse width control circuitry, gain control circuitry, pulse shaping circuitry, single/multi-stage comparator circuitry, analog adder circuitry, buffer circuitry, and other ancillary circuitry known to and practicable in the present invention by the ordinary skilled artisan.

As exemplified in FIG. 5, two (or more) detector pixels 110, symbolized by P1 and P2, are each conductively connected to its own signal conditioning circuit 140 via bump-bond type pixel contact 118 (see FIG. 4). Each signal conditioning circuit 140 includes ancillary conditioning circuitry 144: amplifier stages 144*a* & 144*b*, e.g., for integrating and/or amplifying incoming electrical signals. The conditioned output 148 of each signal conditioning circuit 140 of the pixel signal counting circuit 130 is in electrical communication with a pulse counter circuit 150. In the example illustrated in FIG. 5, the conditioned output 148 of each signal conditioning circuit 140 is fed to an ancillary multi-input comparator stage 144*c* of the pulse counter circuitry 150. The multi-input comparator stage 144*c* screens an incoming analog signal against an output threshold before the incoming signal can be output from the ancillary comparator stage circuitry 144*c* to the pulse counter 160.

The charge amplifier 144*a* can be by far the most significant limitation in overall signal processing speed in current imaging devices in the field. By increasing the number of detector pixels per unit imaging area (i.e., increasing the RC value), with each the signal conditioning circuit 140 for each detector pixel 110 having its own charge amplifier A1 144*a*, the GDPC 105 signal processing speed is substantially increased. This allows the GDPC 105 to handle relatively high input hit rates. Additionally, the first and second stage amplifiers A1 144*a* & A2 144*b* (and further circuitry stages) can include detector dark current compensation circuitry, input pulse width control circuitry, pulse shaping circuitry, gain control circuitry, etc. By thus duplicating the analog signal processing part of the pixel signal counting circuit 130, the input radiation rate and the overall signal processing speed of the present GDPC 105 is increased.

As a practical example of how the current invention can be accomplished, if the imaging area of a prior art photon/pulse counting imaging device is 2 cm×2 cm and the detector pixel size is 0.5 mm×0.5 mm, then there are 1600 image pixel cells in the device. In accordance with the present invention, if the detector pixel surface area (the area of the pixel's charge collector electrode) of the device's detector pixels is subdivided by at least a factor of two, this yields (in this example) detector pixels having dimensions of about 0.25 mm×0.5 mm, and twice the number (or 3200) detector pixels. The number of pixel signal counting circuits remains at 1600. However, pixel cell will now have, in the present invention, two bump-bonds each connecting the two detector pixels of the pixel cell to a set of two inputs to the single pixel signal counting circuit of the pixel cell. As a result, for having the same overall size as a prior art imaging device, the exemplary imaging device of the present invention has: twice the bump-bonds, but the same number of counting circuits. It is evident that this is merely an example and one can choose the splitting of the detector pixel cell size to correspond to a desired value without increasing the number of readout channels. Additionally, because of the reduced size of the detector pixel, the input node capacitance is reduced accordingly, which translates to lower noise at the input of the counting circuit. Still further, the larger number of bump-bonds in the exemplary imaging device results in a concomitant increase in the mechanical adhesion between the semiconductor substrate layers relative to an analogous prior art imaging device.

FIG. 6 exemplifies an alternative embodiment of the pulse counter circuit 150 of the present GDPC 105. In this preferred embodiment, conditioned signal outputs 148 of the signal conditioning circuits 140 communicate with the ancillary multi-input analog adder circuitry 144*d*. The ancillary multi-input analog adder circuitry 144*d* adds together the output signals of the two signal conditioning circuits 140 prior to their processing in the comparator circuitry 144*e*. In this way, if the input radiation hit falls in between two detector pixel 110 and the charge is shared between the two detector pixel's collector electrodes 116 (see FIG. 4), the original pulse amplitude is recovered by adding together the two signal conditioning circuits 140 output signals.

Figure 7:
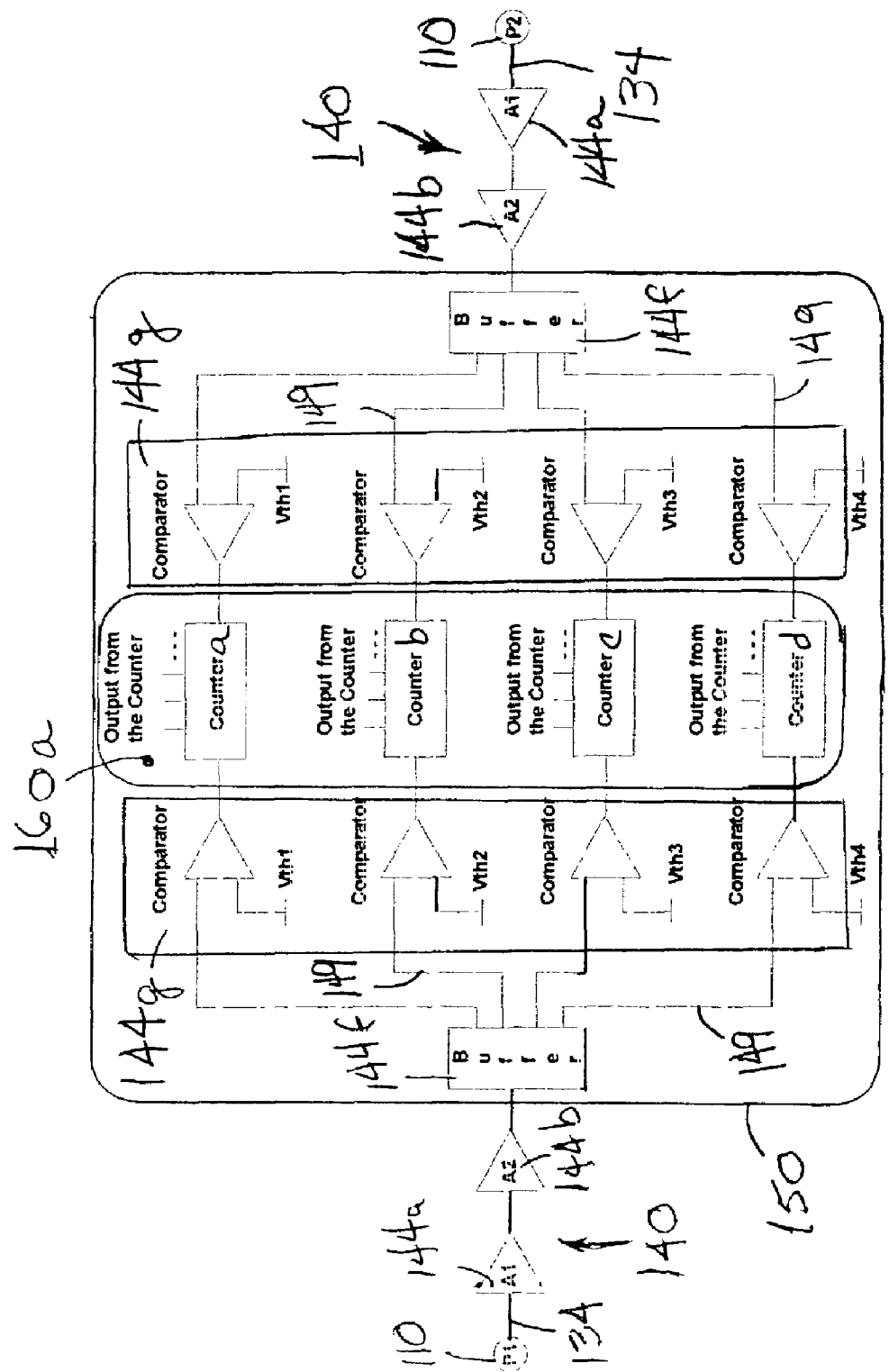
FIG. 7 is a schematic block diagram of the pixel signal counting circuit of the present invention, illustrating multiple (two in the case shown) pixel signal inputs and their associated signal conditioning circuits communicating with an alternative embodiment of the single pulse counter circuit.

FIG. 7 exemplifies another preferred embodiment of the GDPC 105. Two detector pixels 110 (P1 and P2) are each connected to separate pixel input circuits 140. The conditioned pixel signal output 148 of each pixel input circuit 140 communicates with its own ancillary buffer circuitry 144*f*. The buffer outputs 149 communicate with an ancillary multi-stage comparator circuit 144*g*, with each stage of the comparator circuitry 144*g* having a different input threshold voltage Vth1, Vth2, Vth3 and Vth4 for each stage. The outputs of the comparators from the two pixel input circuits 140 with the same threshold voltage then communicate with a common counter 160*a-d* of the pulse counting circuit 150.

Basically, FIG. 7 illustrates an example of a pixel counting circuit 130 of a GDPC 105, where the pixel signal conditioning circuits 140, plus the ancillary signal conditioning/processing circuitry 144 and common multi-stage pulse counter circuitry 150 together comprise a single pixel signal counting circuit 130, that corresponds to the two different detector pixels 110 P1 and P2.

The x-ray and gamma-ray radiation energy imaging device 100 of the present invention has a GDPC 105 comprising an array of detector pixels 110 having a combined planar area of the detector pixels' collector electrodes 116 disposed on the semiconductor detector substrate 112, which planar area is at least about as large as the planar area of the single pixel signal counting circuit 130 disposed on the ASIC readout substrate 134. The GDPCs have a Ratio of Correspondence of the number of pixel detectors to the pixel signal counting circuits of RC≧2, and the overall radiation energy imaging device 100 has a Ratio of Correspondence of RC>1.

While the above description contains many specifics, these should not be construed as limitations on the scope of the invention, but rather as exemplifications of one or another preferred embodiment thereof. Many other variations are possible, which would be obvious to one skilled in the art. Accordingly, the scope of the invention should be determined by the scope of the appended claims and their equivalents, and not just by the embodiments.

What is claimed is:

1. An x-ray and gamma-ray radiation energy imaging device comprising a plurality of ganged-detector pixel cells, arrayed in close proximity with each other in a laminate structure formed of. a semiconductor detector substrate layer bump-bonded to a readout substrate layer, wherein a ganged-detector pixel cell further comprises a plurality of detector pixels disposed on the semiconductor detector layer, the plurality of detector pixels in electrical communication with a single pixel signal circuit disposed on the readout substrate layer, and wherein a Ratio of Correspondence between the plurality of pixel detectors and the pixel circuit in a single ganged-detector pixel cell is greater than one (>1).

2. The x-ray and gamma-ray radiation energy imaging device of claim 1, wherein a ganged-detector pixel cell comprises a detector pixel array having a plurality of detector pixels disposed on a semiconductor detector substrate, the detector pixels of the pixel array in electrical communication with a single pixel signal counting circuit disposed on an ASIC readout substrate.

3. The ganged-detector pixel cell of claim 2, wherein the detector pixel array comprises a plurality of detector pixels processed onto the detector substrate, the detector substrate having a radiation surface and a pixel surface on which pixel surface the detector pixels are disposed and in combination substantially cover the pixel surface, with each pixel detector further comprising a pixel collector electrode and an associated pixel contact, the pixel collector electrode for collecting electrical charges generated in the semiconductor detector substrate, and the pixel contact in communication with the single pixel counting circuit for conducting the electrical charges out of the pixel detector.

4. The x-ray and gamma-ray radiation energy imaging device of claim 2, wherein the plurality of ganged-detector pixel cells comprises a plurality of pixel signal counting circuits processed in a circuit array onto the ASIC readout substrate, the ASIC readout substrate having a readout surface disposed opposite a pixel surface of the detector substrate, with each pixel cell having a single pixel signal counting circuit with multiple pixel signal inputs processed on the readout surface of the pixel cell, the multiple pixel signal inputs being in electrical communication with the pixel signal counting circuit of the ASIC readout substrate.

5. The ganged-detector pixel cell of claim 4, wherein the pixel signal counting circuit has multiple pixel signal inputs, each pixel signal input in electrical communication with a separate detector pixel contact of the detector pixel array.

6. The pixel signal counting circuit of claim 5, wherein the multiple pixel signal inputs each comprises a pixel signal conditioning circuit.

7. The pixel signal counting circuit of claim 5, wherein the multiple pixel signal inputs each comprises a pixel signal conditioning circuit having at least one ancillary conditioning circuit selected from the group consisting of: signal amplification circuitry, dark current compensation circuitry, pulse width control circuitry, gain control circuitry, pulse shaping circuitry, comparator circuitry, analog adder circuitry, and buffer circuitry.

8. The ganged-detector pixel cell of claim 3, wherein the pixel contact disposed on each pixel electrode for conducting the electrical charges out of the pixel detector is a bump-bond.

9. The ganged-detector pixel cell of claim 3, wherein the pixel contact disposed on each pixel electrode for conducting the electrical charges out of the pixel detector is a solder bump-bond.

10. An x-ray and gamma-ray radiation energy imaging device comprising at least one ganged-detector pixel cell, the pixel cell having a number of detector pixels in electrical communication with a lesser number of pixel signal counting circuits.

11. The x-ray and gamma-ray radiation energy imaging device of claim 1, wherein a ganged-detector pixel cell comprises a detector pixel array having at least four detector pixels disposed on the semiconductor detector substrate, the detector pixels of the pixel array in electrical communication with a single pixel signal counting circuit disposed on the ASIC readout substrate.

12. The x-ray and gamma-ray radiation energy imaging device of claim 1, wherein a ganged-detector pixel cell comprises a detector pixel array having a combined planar area of the detector pixels' collector electrodes disposed on the semiconductor detector substrate, which planar area is at least about as large as a planar area of the single pixel signal counting circuit disposed on the ASIC readout substrate.

13. A ganged-detector pixel cell for use in a high energy radiation digital imaging device, wherein the ganged-detector pixel cell comprises a detector pixel array of multiple detector pixels closely disposed on a semiconductor detector substrate, the detector pixels all in electrical communication with a single pixel signal counting circuit, the pixel signal counting circuit disposed on a semiconductor readout substrate adjacent the semiconductor detector substrate.

14. A ganged-detector pixel cell of claim 13, having a Ratio of Correspondence of the number of pixel detectors to the number of pixel signal counting circuits which is at least 2.

* * * * *